(12) United States Patent
Li et al.

(10) Patent No.: US 10,741,441 B2
(45) Date of Patent: Aug. 11, 2020

(54) COLLAR FORMATION FOR CHAMFER-LESS AND CHAMFERED VIAS

(71) Applicant: International Business Machines Corporation, Armonk, NY (US)

(72) Inventors: Baozhen Li, South Burlington, VT (US); Chih-Chao Yang, Glenmont, NY (US); Andrew Tae Kim, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/145,733

(22) Filed: Sep. 28, 2018

(65) Prior Publication Data
US 2020/0105590 A1    Apr. 2, 2020

(51) Int. Cl.
*H01L 21/768* (2006.01)
*H01L 23/522* (2006.01)

(52) U.S. Cl.
CPC .. *H01L 21/76834* (2013.01); *H01L 21/76802* (2013.01); *H01L 21/76804* (2013.01); *H01L 21/76805* (2013.01); *H01L 21/76829* (2013.01); *H01L 21/76831* (2013.01); *H01L 21/76832* (2013.01); *H01L 21/76877* (2013.01); *H01L 23/5226* (2013.01)

(58) Field of Classification Search
CPC ......... H01L 21/76831; H01L 21/76834; H01L 21/76832; H01L 21/76829; H01L 21/76877; H01L 21/76802; H01L 21/76805; H01L 21/76807; H01L 23/5226
See application file for complete search history.

(56) References Cited

U.S. PATENT DOCUMENTS

| | | |
|---|---|---|
| 5,545,590 A | 8/1996 | Licata |
| 6,914,320 B2 | 7/2005 | Chen et al. |
| 7,514,361 B2 | 4/2009 | Bonilla et al. |
| 7,745,282 B2 | 6/2010 | Yang et al. |
| 7,859,113 B2 | 12/2010 | Edelstein et al. |
| 8,039,966 B2 | 10/2011 | Yang et al. |
| 8,138,604 B2 | 3/2012 | Yang et al. |
| 8,299,625 B2 | 10/2012 | Ponoth et al. |
| 9,287,164 B2 | 3/2016 | Uzoh et al. |
| 2007/0013069 A1* | 1/2007 | Tada .......... H01L 21/76802 257/758 |
| 2017/0338192 A1* | 11/2017 | Lee ............ H01L 23/5226 |

FOREIGN PATENT DOCUMENTS

KR    1020070071025 A    7/2007

* cited by examiner

*Primary Examiner* — Thanhha S Pham
(74) *Attorney, Agent, or Firm* — Cantor Colburn LLP; Alvin Borromeo

(57) ABSTRACT

A via and a method of fabricating a via in an integrated circuit involve forming a trench in dielectric material deposited above a first cap of a first metal level. The method includes patterning a collar from insulator material directly above the first cap, and etching through the first cap, within an area surrounded by the collar, to a first metal layer of the first metal level directly below the first cap. A liner is conformally deposited. The liner lines sidewalls of the collar. A metal conductor is deposited to form the via and a second metal layer of a second metal level.

2 Claims, 12 Drawing Sheets

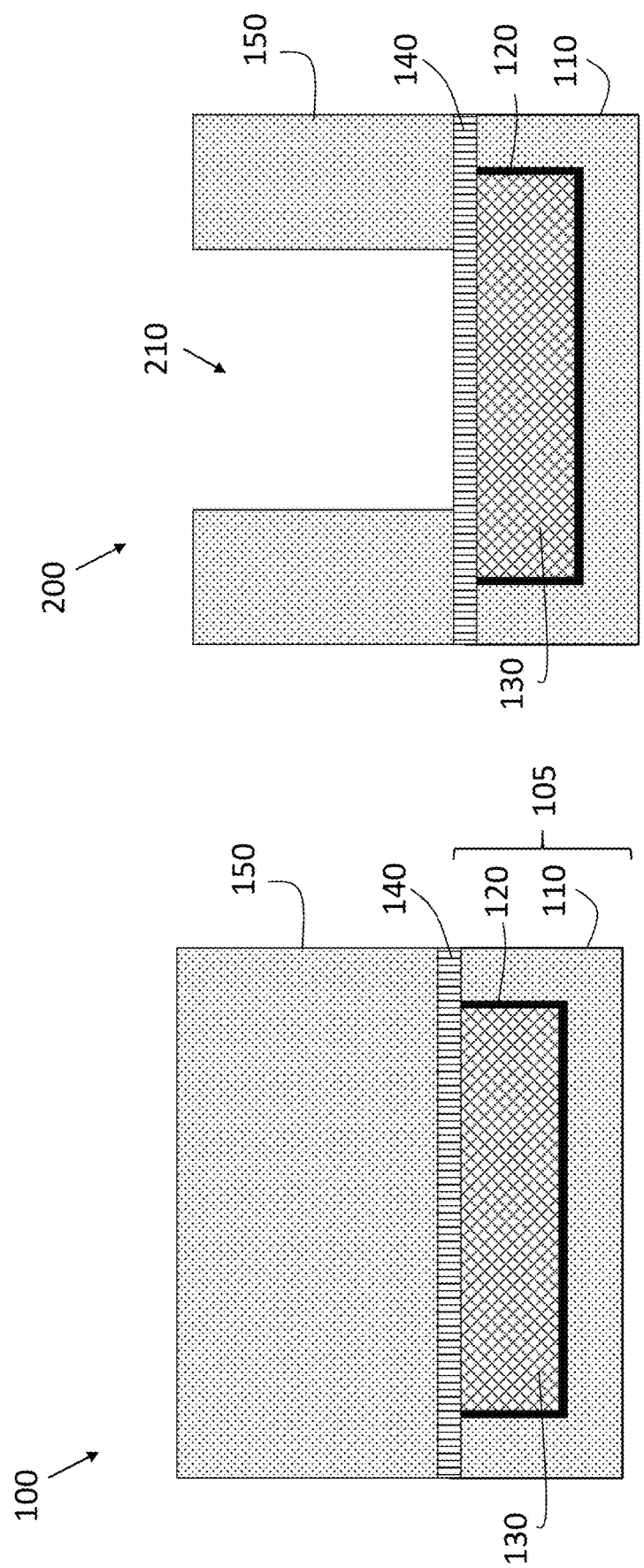

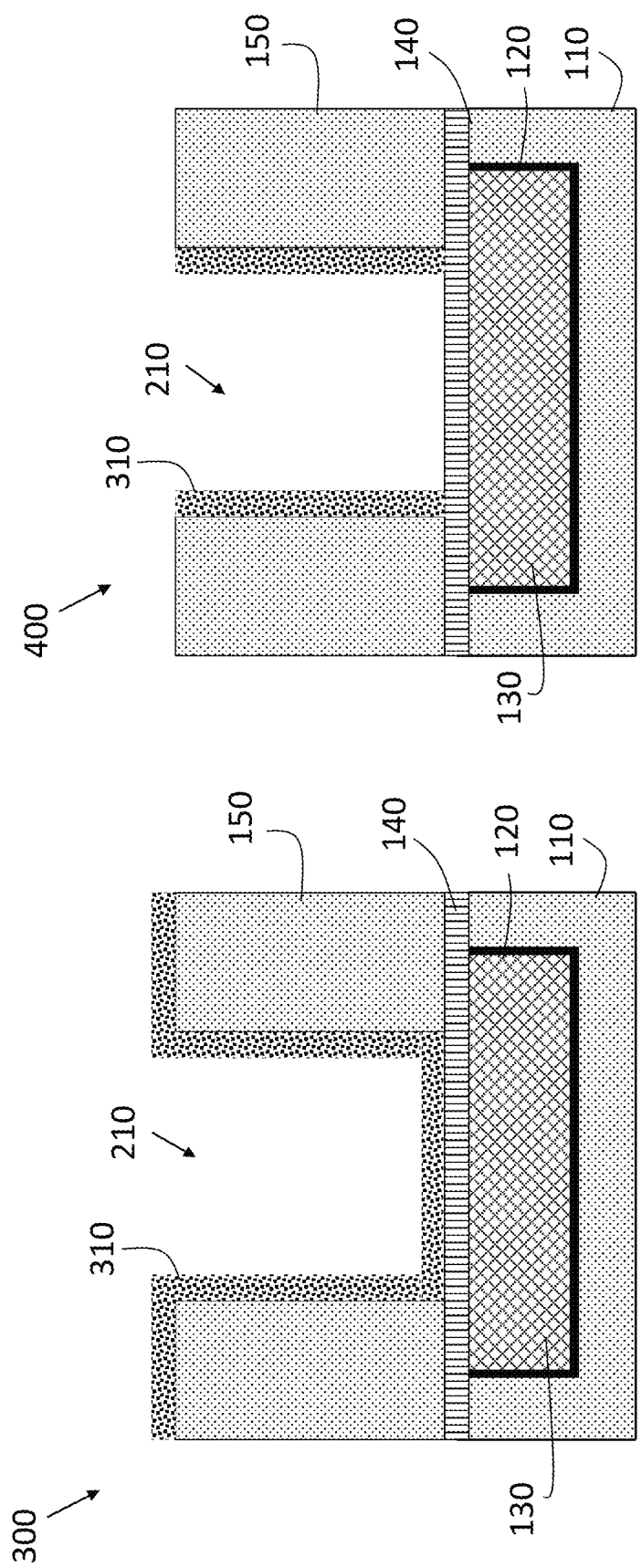

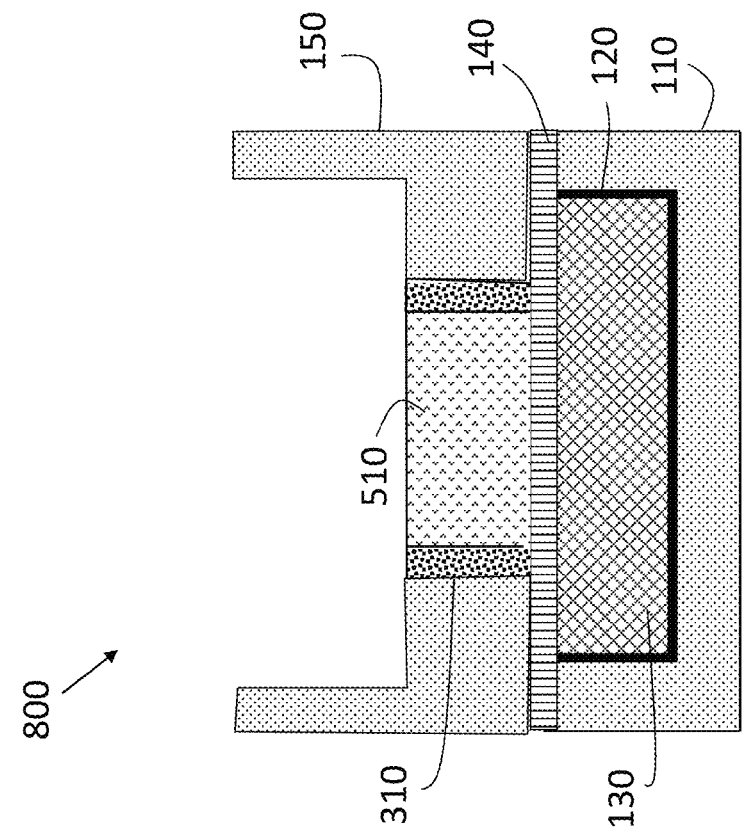
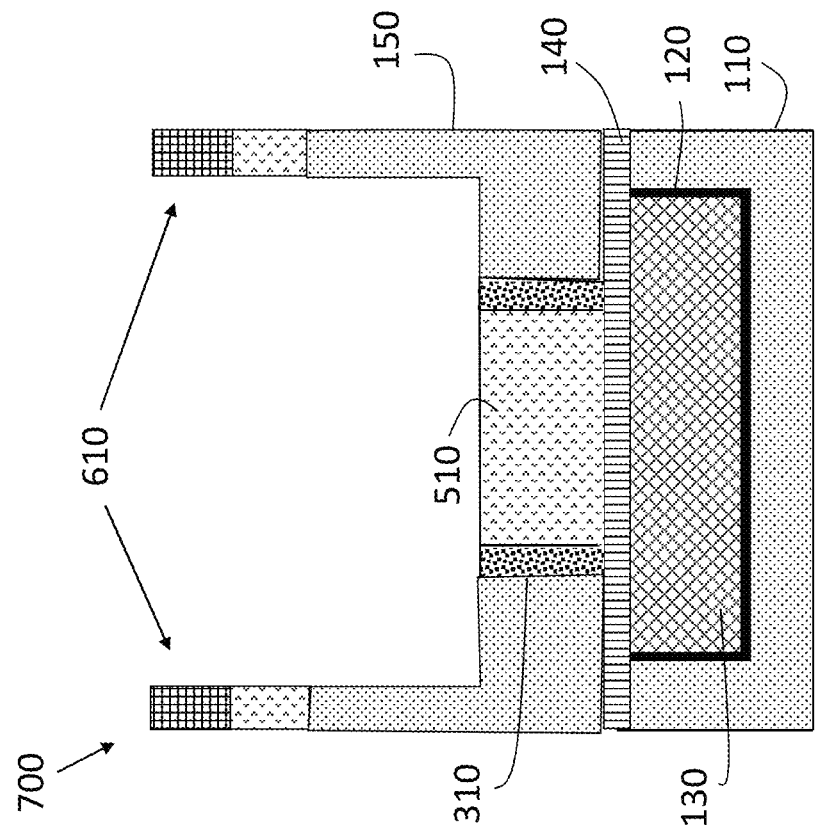

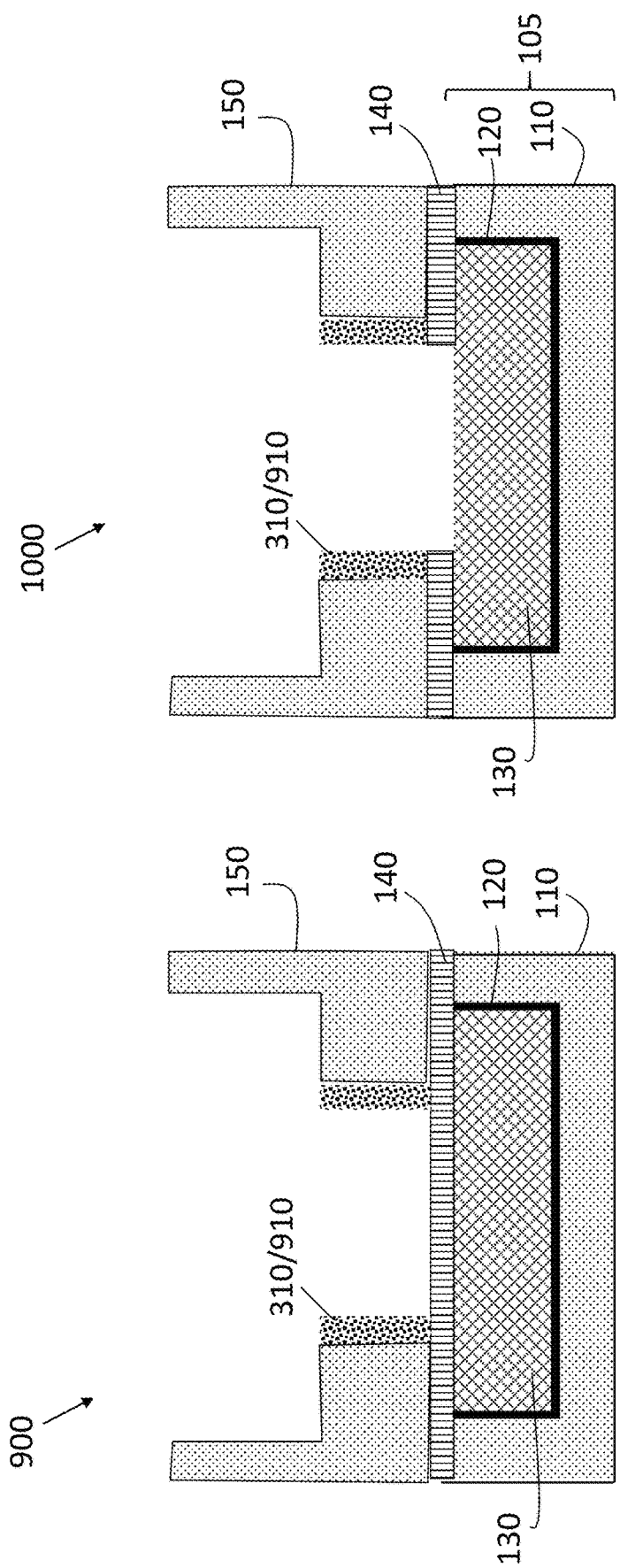

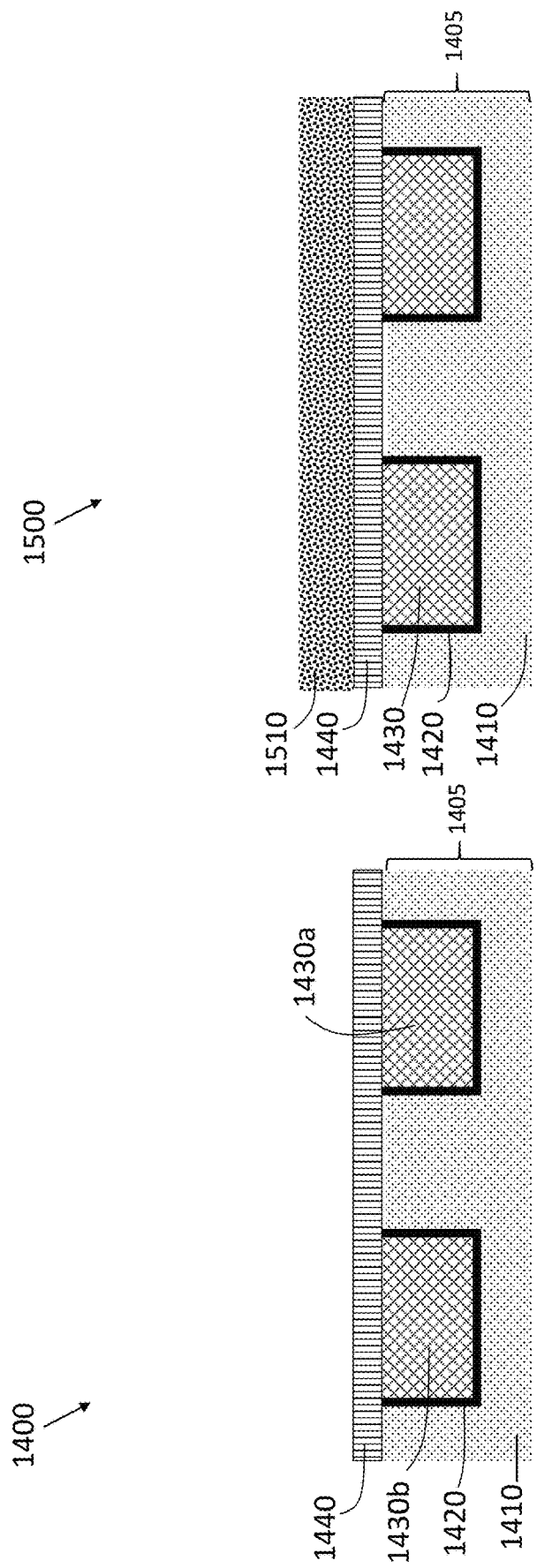

COLLAR FORMATION FOR CHAMFER-LESS AND CHAMFERED VIAS

BACKGROUND

The present invention relates to integrated circuit (IC) interconnects, and more specifically, to collar formation for chamfer-less and chamfered vias.

An integrated circuit (i.e. chip) can have multiple metal layers, also referred to as metal lines. While components (e.g., logic gates, latches) within the same metal layer can be connected by wiring, components on two different metal layers are interconnected by a vertical electrical connection called a via. Thus, multiple metal layers Mx (e.g., $M_1$, $M_2$, ..., $M_n$) can have multiple via layers Vx (e.g., $V_1$, $V_2$, ..., $V_{n-1}$) to interconnect components. A via can be chamfered (i.e., wider at $Mx_{+1}$ level than at Mx level, or via with slanted side walls) or chamfer-less (i.e., a column between the $Mx_{+1}$ and Mx levels, or via with vertical sidewalls).

SUMMARY

Embodiments of the present invention are directed to integrated circuits and methods of fabricating a via in an integrated circuit. The method includes forming a trench in dielectric material deposited above a first cap of a first metal level, and patterning a collar from insulator material directly above the first cap. The method also includes etching through the first cap, within an area surrounded by the collar, to a first metal layer of the first metal level directly below the first cap. A liner is conformally deposited. The liner lines sidewalls of the collar, and a metal conductor is deposited to form the via and a second metal layer of a second metal level.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIGS. 1-13 illustrate a process flow to fabricate a full collar chamfer-less via according to one or more embodiments of the invention, in which:

FIG. 1 is a cross-sectional view of a dielectric material formed on a cap of a metal level;

FIG. 2 shows a trench formed in the dielectric material;

FIG. 3 is a cross-sectional view of a structure that includes conformal deposition of an insulator material;

FIG. 4 shows a result of removing the insulator material from horizontal surfaces;

FIG. 5 is a cross-sectional view of a structure that includes deposition of an organic planarization layer (OPL) in the trench formed in the dielectric material;

FIG. 6 shows lithographic masks above the OPL;

FIG. 7 is a cross-sectional view of a structure resulting from a lithographic etch of the structure shown in FIG. 6;

FIG. 8 is a cross-sectional view of a structure resulting from a reactive ion etch of the structure shown in FIG. 7;

FIG. 9 is a cross-sectional view showing the collar patterned from the insulator material;

FIG. 10 shows the structure that results from an etch through the cap within the collar;

FIG. 11 is a cross-sectional view that shows a conformal deposition of a liner;

FIG. 12 shows the structure that results from metallization and planarization of the structure shown in FIG. 11; and FIG. 13 shows the full collar chamfer-less via with a metal level above and a cap formed on the metal level.

FIG. 14-20 illustrate a process flow to fabricate a partial collar chamfered via according to one or more embodiments of the invention, in which:

FIG. 14 is a cross-sectional view of a metal level with two metal layers and a cap formed above;

FIG. 15 shows deposition of an insulator material on the cap;

FIG. 16 is a cross-sectional view showing formation of the collar from the insulator material;

FIG. 17 shows the structure that results from the deposition of a dielectric material on the insulator material and the cap;

FIG. 18 is a cross-sectional view showing the result of patterning a trench in the dielectric material, patterning the insulator material as a collar, and an etch of the cap within the collar;

FIG. 19 results from the deposition of a liner in the trench; and

FIG. 20 shows the partial collar chamfered via with a metal level above and a cap formed on the metal level.

DETAILED DESCRIPTION

As previously noted, a chip can include multiple metal layers Mx with components that are interconnected across the metal layers by multiple via layers Vx. The vias can be chamfered or chamfer-less. One of the challenges to having a high operating voltage Vmax is the smallest distance (Smin) between a metal layer and the via connecting that metal layer to a higher metal layer. When a via is chamfered, the angle between the chamfered via and the lower metal layer is less than 90 degrees as it is for a chamfer-less via. As a result, the Smin is smaller for a chamfered via than for a chamfer-less via, and, consequently, the Vmax is lower to prevent Time Dependent Dielectric Breakdown (TDDB) failures. One prior approach has involved using a chamfer-less via to address the issue of maximizing Smin to thereby allow a higher Vmax. Another approach has involved forming a fully aligned via to move the chamfer portion higher and thereby increase the Smin. Both of these approaches benefit from the collar formation according to one or more embodiments of the invention. As detailed, a full collar can be formed around a chamfer-less via or a partial collar can be formed around a chamfered via that has the chamfered portion above the collar and, thus, farther from the lower metal level for Smin improvement. The insulator material that makes up the collar prevents a short circuit caused by TDDB between the via and the metal layer below. Thus, a higher Vmax can be used.

Figure 12:
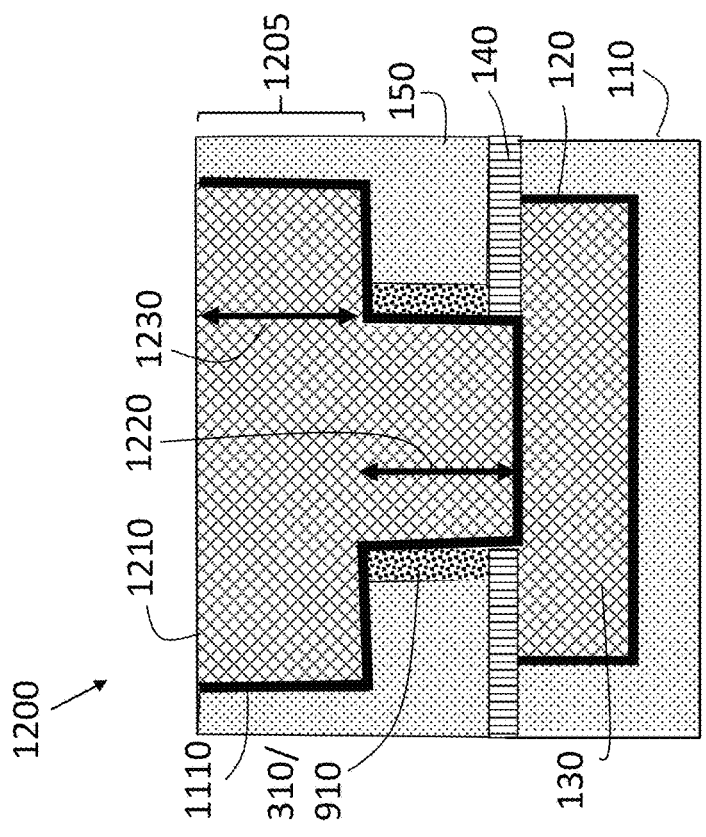
Figure 11:
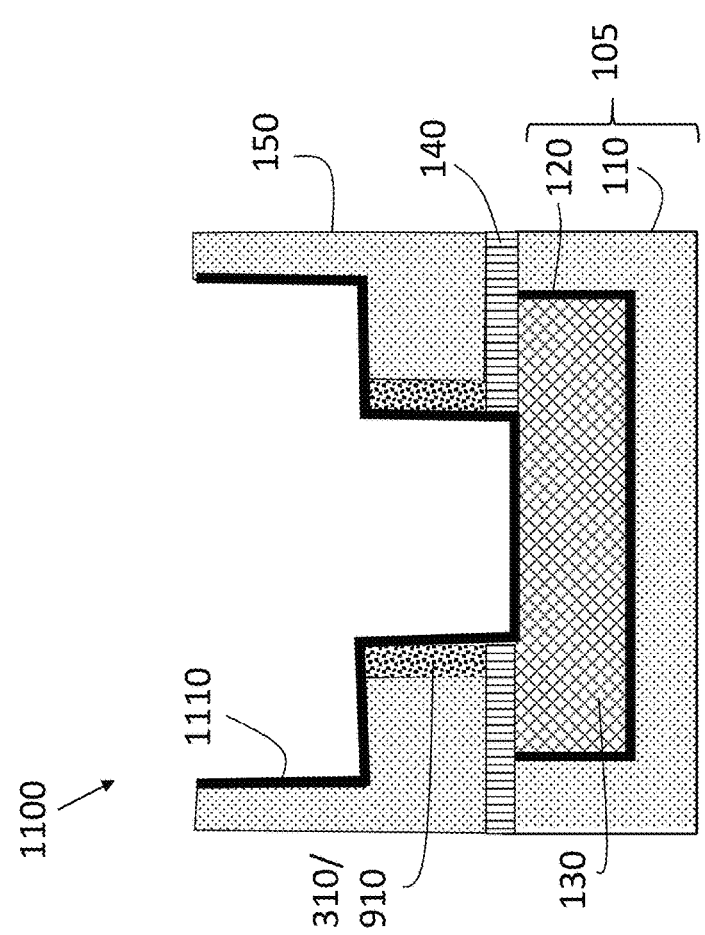
Figure 13:
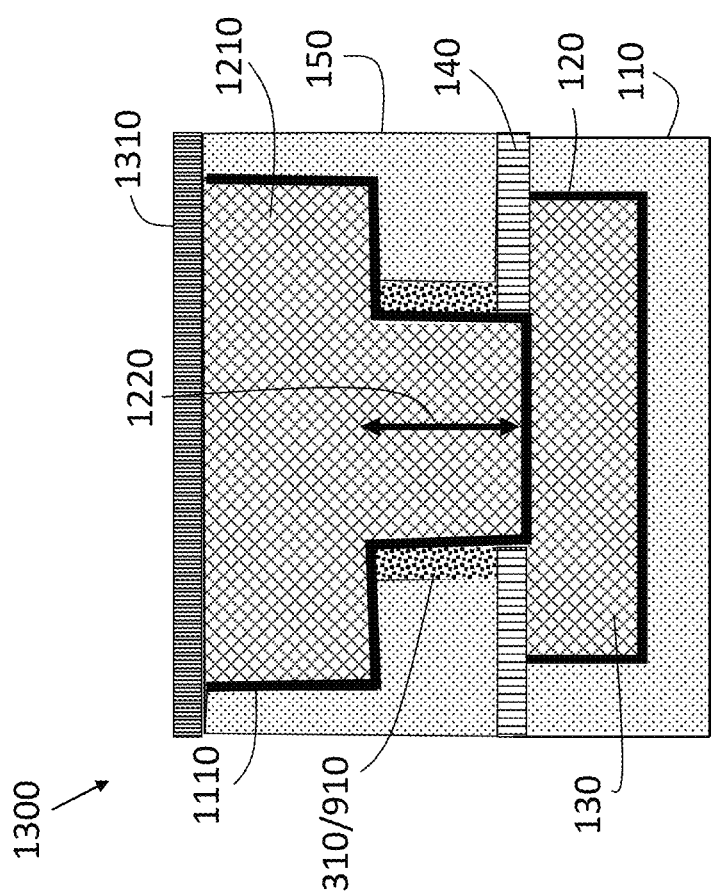
Figure 17:
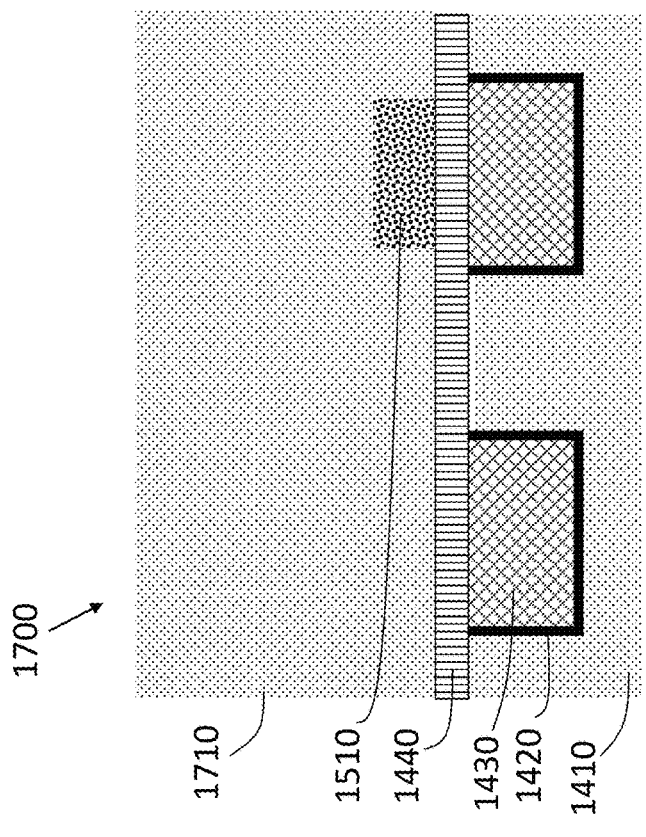

FIGS. 1-13 illustrate the process flow to fabricate a full collar chamfer-less via 1220 (FIG. 12) according to one or more embodiments of the invention. FIG. 1 is a cross-sectional view of a structure 100 showing aspects of a metal level 105 with a cap 140 over the metal level 105. The metal level 105 includes a low-k dielectric material 110, a liner material 120, and a metal conductor 130 that is separated from the low-k dielectric material 110 by the liner material 120. The liner material 120 can be tantalum nitride (TaN), Ta, Ta/TaN, cobalt (Co), Rhodium (Rh), or titanium nitride (TiN), for example. The metal conductor 130 can be copper (Cu), Co, Rh or aluminum (Al), for example. A dielectric 150 is deposited on the cap 140 of the metal level 105. The dielectric 150 is a low-k material and can be the same material as the low-k dielectric material 110 of the metal level 105. FIG. 2 is a cross-sectional view of a structure 200 that results from patterning into the dielectric 150. The patterning can be performed by a reactive ion etch (ME) process, for example. As FIG. 2 indicates, a trench 210 is formed by the patterning.

FIG. 3 is a cross-sectional view of structure 300 resulting from conformal deposition of an insulator 310. This insulator 310 is ultimately formed into the collar 910 (FIG. 9). As FIG. 3 indicates, the insulator 310 is conformally deposited in the trench 210 of the structure 200 shown in FIG. 2 and also above the remaining dielectric 150. A chemical vapor deposition (CVD) or physical vapor deposition (PVD) process can be used for the conformal deposition, for example. The insulator 310 can have one or more layers. An exemplary composition of the insulator 310 can include silicon carbide (SiC), silicon nitride (SiN), silicon carbide nitride (SiCN), silicon carbide hydride (SiCH), or silicon oxynitride (SiOxNy). FIG. 4 shows a structure 400 that results from directional bombardment to remove the insulator 310 from horizontal surfaces.

Figure 6:
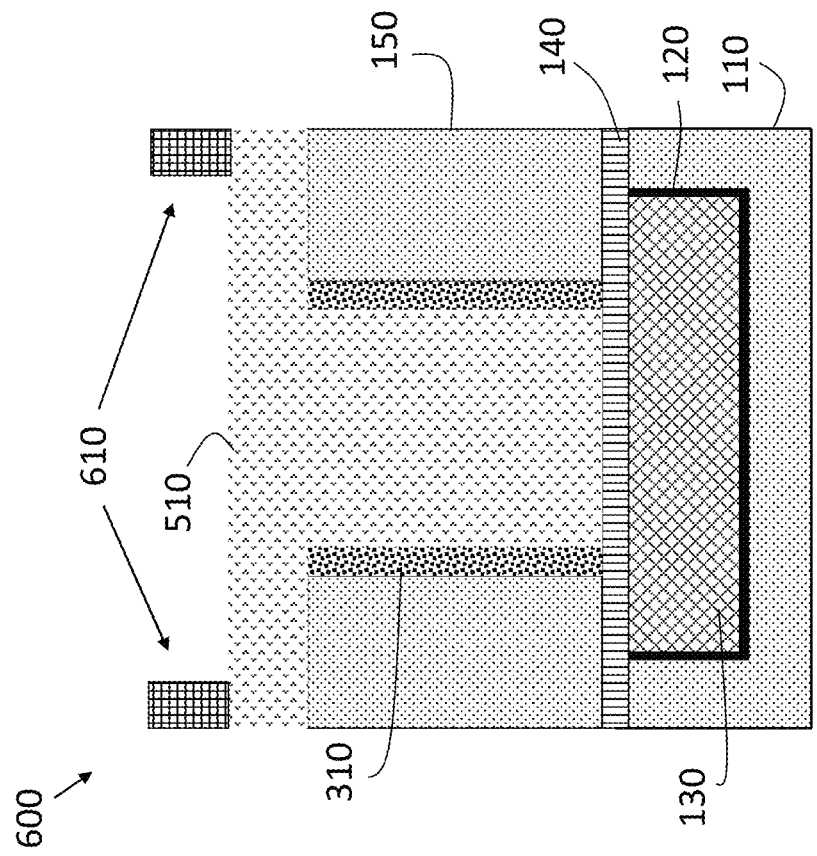
Figure 5:
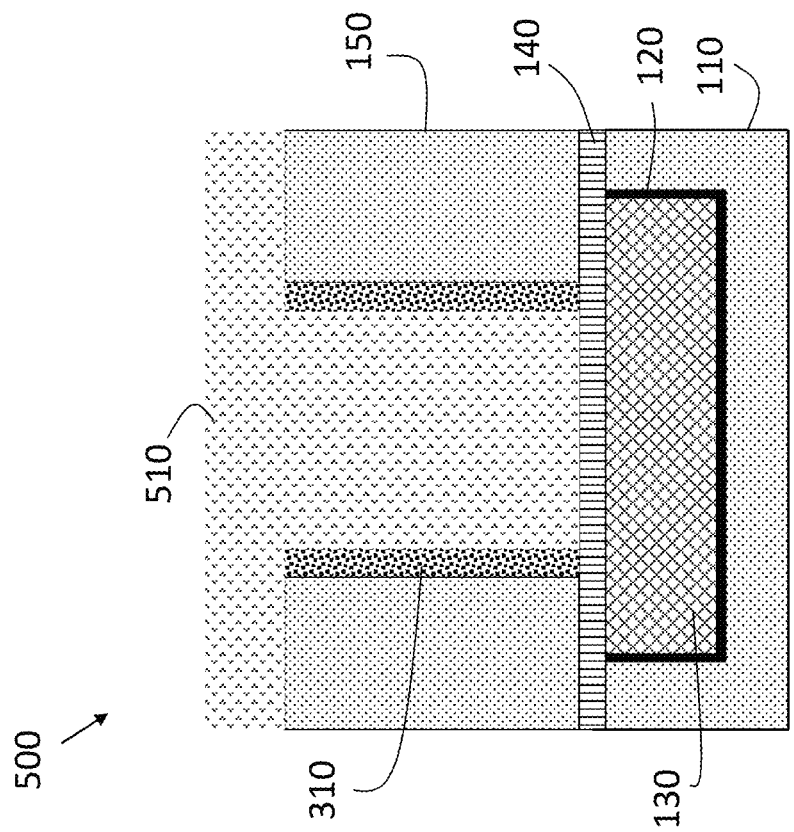

FIG. 5 is a cross-sectional view of a structure 500 resulting from the deposition of an organic planarization layer (OPL) 510 in the remaining trench 210 of structure 400 shown in FIG. 4. A lithographic mask 610 is deposited on the OPL 510 to result in the structure 600 shown in FIG. 6. FIG. 7 shows a structure 700 that results from an ME process to etch through some of the OPL 510 and dielectric 150 that is not protected by the lithographic mask 610. Removal of the lithographic mask 610 and the OPL 510 below results in the structure 800 shown in FIG. 8.

FIG. 9 is a cross-sectional view of a structure 900 that results from an OPL 510 strip. Some of the insulator 310 is also removed, leaving only the collar 910. The cap 140 over the metal level 105 inside the collar 910 is removed to result in the structure 1000 shown in FIG. 10. The removal can be accomplished by an ME process or a wet etch, for example. A conformal liner 1110 is deposited on the structure 1000 shown in FIG. 10 to result in the structure 1100 shown in FIG. 11. The conformal liner 1110 can be the same material as the liner material 120 of the metal level 105. A metallization process (e.g, seed deposition and then Cu plating) followed by a chemical mechanical planarization (CMP) process is performed on the structure 1100 to result in the structure 1200 shown in FIG. 12. The metal 1210 deposited above the conformal liner 1110 and planarized results in a chamfer-less via 1220 and metal layer 1230 of the next higher metal level 1205 to the metal level 105. The metal 1210 can be the same material (e.g., copper) as the metal conductor 130. A cap 1310 is formed above the metal 1210 to form the structure 1300 shown in FIG. 13. As FIG. 13 indicates, the chamfer-less via 1220 is surrounded by the collar 910 formed by the insulator 310. As previously noted, this collar 910 facilitates operation of the integrated circuit with a higher Vmax than would be possible without the collar 910. The processes discussed with reference to FIGS. 1 through 13 to form a full collar chamfer-less via 1220 need not be performed for every via in a given chip. Some or all of the vias that are determined to be critical for TDDB can be formed as full collar chamfer-less vias 1220.

FIGS. 14-20 illustrate the process flow to fabricate a partial collar chamfered via 2035 (FIG. 20) according to one or more embodiments of the invention. FIG. 14 is a cross-sectional view of a structure 1400 that shows aspects of the formation of an integrated circuit. Specifically, FIG. 14 shows a cross-sectional view of a metal level 1405 with a cap 1440 formed above. The metal level 1405 includes a low-k dielectric material 1410 and two areas with a liner material 1420 and a metal conductor 1430 that is separated from the low-k dielectric material 1410 by the liner material 1420. That is metal conductor 1430a and metal conductor 1430b, both of which are separated from the low-k dielectric material 1410 by liner material 120, are part of the metal level 1405. Exemplary liner material 1420 can be tantalum nitride (TaN), Ta, Ta/TaN, Co, Rh, or TiN]. The metal conductor 1430 can be Cu, Co, Rh or Al, for example. An insulator 1510 is deposited on the cap 1440 over the metal level 1405 to form the structure 1500 shown in FIG. 15.

Figure 16:
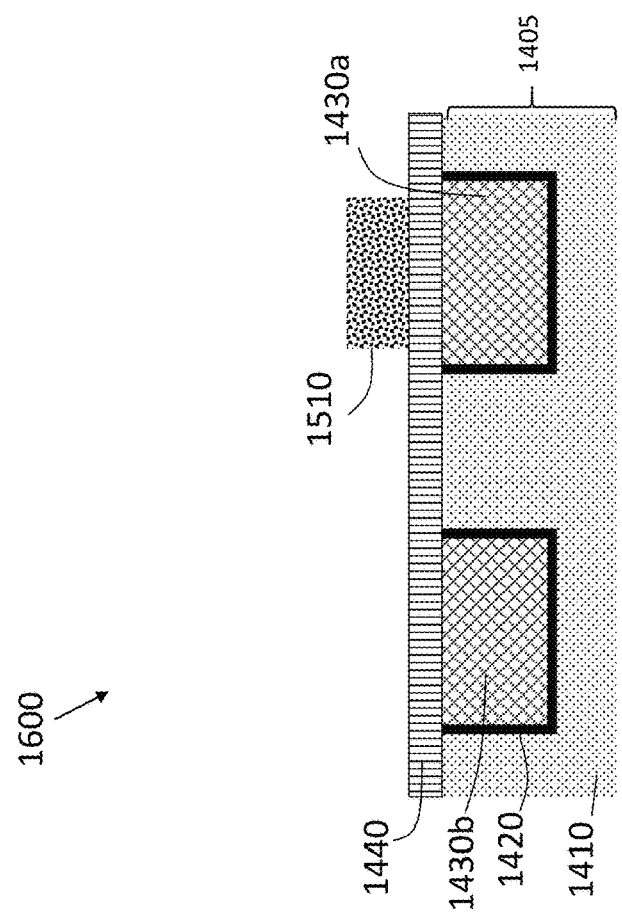
Figure 18:
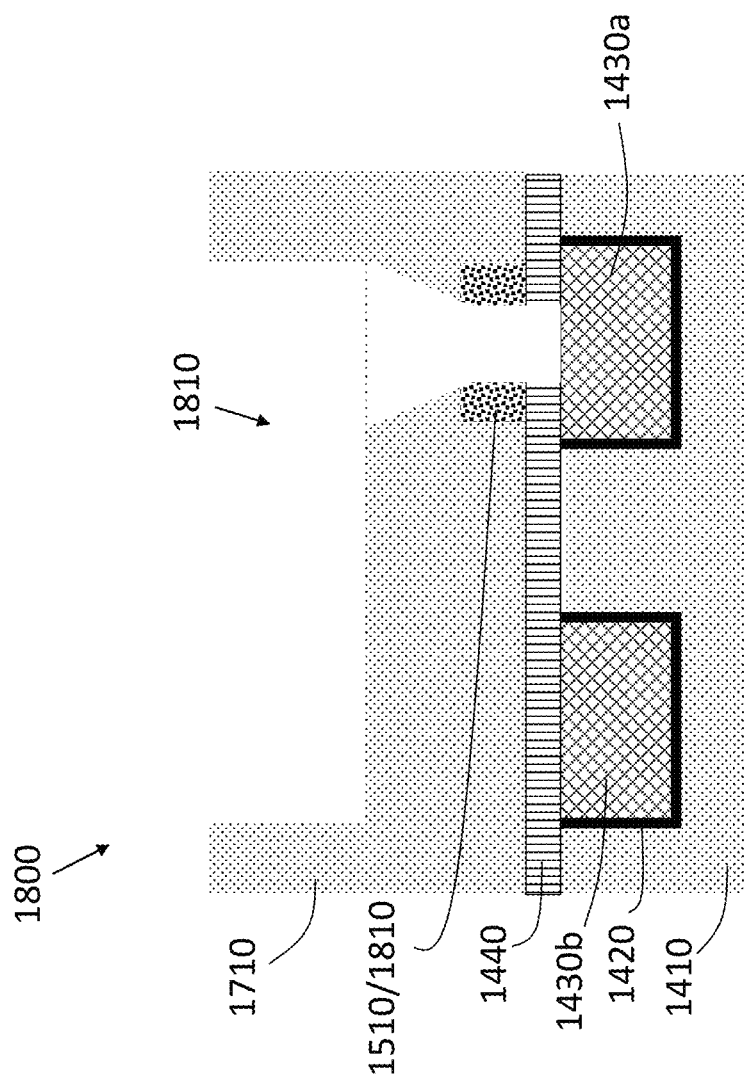

FIG. 16 is a cross-sectional view of a structure 1600 that shows patterning of the insulator 1510 such that remaining insulator 1510 is only above one of the selected metal conductors 1430 (i.e., metal conductor 1430a in the illustrated example) of the metal level 1405. The patterning can involve an RIE process, or selective deposition can be performed. A dielectric 1710 is then deposited on the cap 1440 and insulator 1510 to form the structure 1700 shown in FIG. 17. The dielectric 1710 can be an interlayer dielectric (ILD) and can be the same material as the low-k dielectric material 1410. An RIE process can be used to etch through the dielectric 1710, the insulator 1510, and the cap 1440 above one metal conductor 1430 of the metal level 1405 to result in the structure 1800 shown in FIG. 18. The patterning of the insulator 1510 results in the collar 1810 that surrounds a chamfer-less portion 2030 (FIG. 20) of a via 2035 (FIG. 20) above the metal conductor 1430a.

Figure 19:
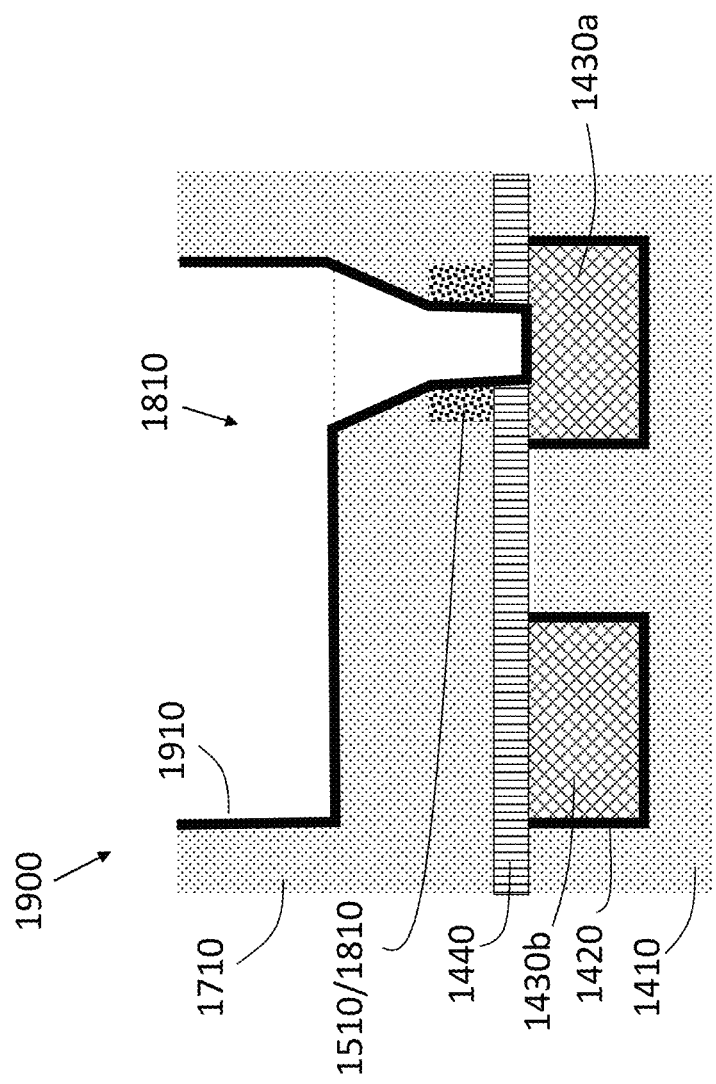
Figure 20:
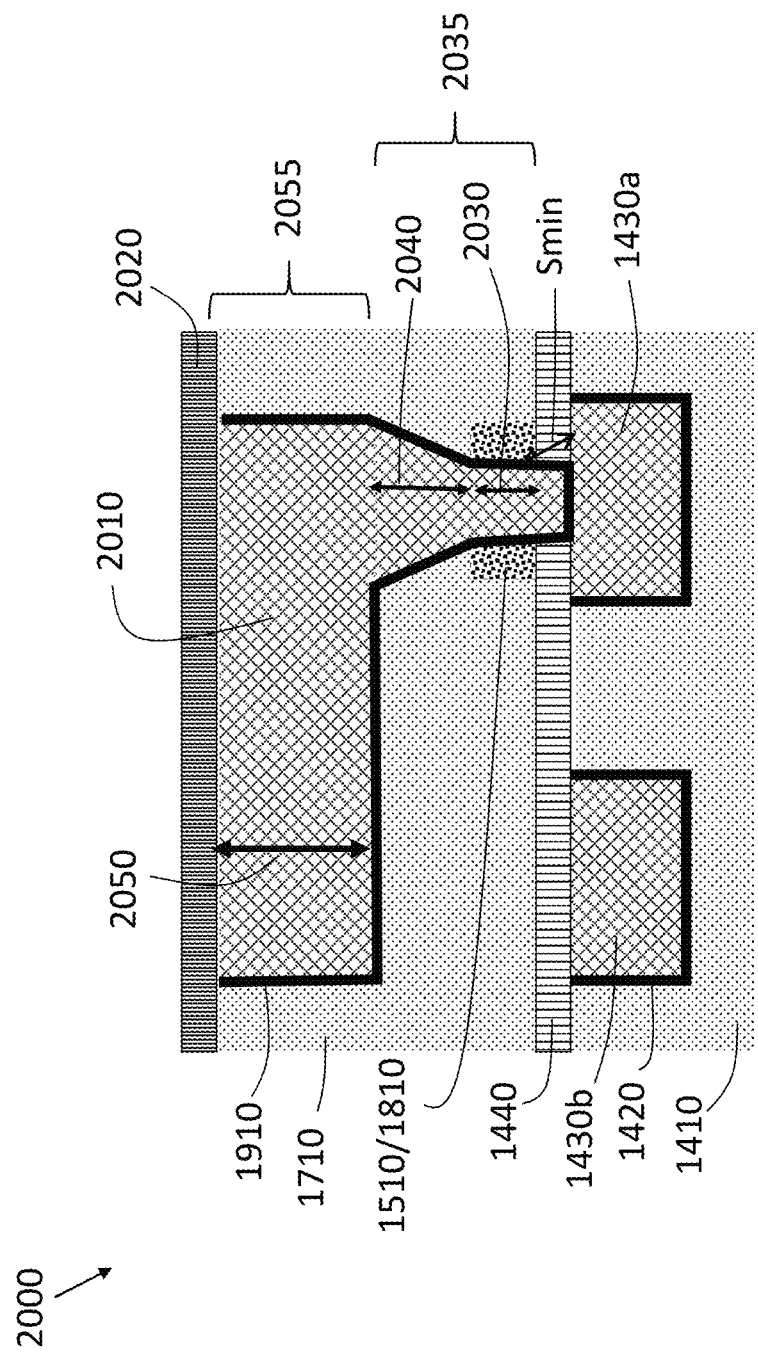

FIG. 19 is a cross-sectional view of a structure 1900 that shows a conformal liner 1910 deposited as shown. The conformal liner 1910 can be the same material as the liner material 1420 of the metal level 1405. At this stage, a metallization process is followed by a CMP process and a cap 2020 formation process to result in the structure 2000 whose cross-section is shown in FIG. 20. The metal 2010 deposited above the conformal liner 1910 and planarized results in the via 2035 and metal layer 2050 of the next higher metal level 2055 to the metal level 1405. The metal 2010 can be the same material (e.g., copper) as the metal conductor 1430. The cap 2020 can be the same material as the cap 1440 formed on the metal level 1405. The via 2035 includes a chamfer-less portion 2030 above the metal conductor 1430a and a chamfered portion 2040 above the chamfer-less portion 2030. As previously noted, having the chamfer-less portion 2030 above the metal conductor 230, rather than the chamfered portion 2040, reduces Smin. Further, the insulator 1510 that forms the collar 1810 further reduces any chance of a short circuit caused by TDDB that limits the Vmax used. As FIG. 20 illustrates, every metal conductor (e.g., 1430b) of a given metal level (e.g, 1405) need not have a via (1220, 2025) associated with it. The via (1220, 2025) is only needed when an interconnect to a different metal level is needed. As noted with reference to the full collar chamfer-less via 1220, the processes discussed with reference to FIGS. 14 through 20 to form a partial collar chamfered via 2025 need not be performed for every via in a given chip. Some or all of the vias that are determined to be critical for TDDB can be formed as full collar chamfer-less vias 1220 or partial collar chamfered vias 2025.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etching processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a via in an integrated circuit, the method comprising:

forming a trench in a layer of dielectric material deposited above a first cap of a first metal level, wherein the dielectric material is a same material over all of the layer;

depositing insulator material conformally in the trench formed in the layer of the dielectric material directly above the first cap;

patterning a collar from the insulator material by etching a portion of the insulator material deposited directly on and contacting horizontal surfaces of the first cap and by etching a portion of the insulator material deposited directly on and contacting horizontal surfaces of the dielectric material;

depositing an organic planarization layer (OPL) in the trench and over the collar after etching the portions of the insulator material;

performing a lithographical process and a reactive ion etch process to remove portions of the OPL, dielectric material and collar to form the via as a chamfer-less via that fully surrounded by the collar;

removing remaining portions of the OPL;

etching through the first cap, within an area surrounded by the collar, to a first metal layer of the first metal level directly below the first cap;

depositing a liner conformally, wherein the liner is on the first metal layer and lines sidewalls of the collar; and depositing a metal conductor on the liner to form the via directly above the liner on the first metal layer and a second metal layer of a second metal level directly above the via.

2. The method according to claim 1, further comprising forming a second cap above the second metal level.

* * * * *